United States Patent [19]

Li et al.

[11] Patent Number: 5,483,183

[45] Date of Patent: Jan. 9, 1996

[54] BIPOLAR CURRENT SENSE AMPLIFIER

[75] Inventors: Richard C. Li; Chau-Chin Wu; Ta-Ke Tien, all of Cupertino, Calif.

[73] Assignee: Integrated Device Technology, Inc., San Jose, Calif.

[21] Appl. No.: 194,773

[22] Filed: Feb. 10, 1994

[51] Int. Cl.⁶ .............................. G01R 19/00; H03F 3/45
[52] U.S. Cl. ................................... 327/54; 327/52; 327/65
[58] Field of Search .................................. 327/51–56, 65, 327/67; 330/252, 261; 365/205

[56] References Cited

U.S. PATENT DOCUMENTS

| 3,760,194 | 9/1973 | Lutz et al. | 327/52 |
| 4,415,995 | 11/1983 | Glock | 327/55 |
| 5,144,171 | 9/1992 | Huard | 327/54 |
| 5,287,314 | 2/1994 | Flannagan et al. | 327/52 |

*Primary Examiner*—Toan Tran
*Attorney, Agent, or Firm*—Skjerven, Morrill, MacPherson, Franklin & Friel; Alan H. MacPherson; David T. Millers

[57] ABSTRACT

In a sense amplifier, collectors of a first pair of transistors are connected to and drive the bases of a pair of output transistors, and the bases of the first pair of transistors and the emitters of the pair of output transistors are coupled to input nodes of the sense amplifier. The speed of the sense amplifier is enhanced over the prior art because changes in currents (or voltages) on the input nodes change both the emitter and base voltages of the pair of output transistors.

9 Claims, 2 Drawing Sheets

BIPOLAR CURRENT SENSE AMPLIFIER

FIELD OF THE INVENTION

This invention relates to sense amplifiers and more particularly, to high speed current sense amplifiers for semiconductor memories.

BACKGROUND OF THE INVENTION

Sense amplifiers are commonly employed to sense the states of circuits such as memory cells and to amplify currents or voltages representative of such states. FIG. 1 shows a conventional sense amplifier 100 connected to a column of memory cells 1,2, ... M. Sense amplifier 100 has input nodes Vin and $\overline{\text{Vin}}$ coupled respectively to emitters of bipolar transistors Q1 and Q2 and to current sources I1 and I2. The bases of transistors Q1 and Q2 are coupled to node V3, which is connected through a current source I3 to ground and connected through a resistor R0 to a supply voltage Vcc. The collectors of transistors Q1 and Q2 are connected to output nodes Vout and $\overline{\text{Vout}}$ of sense amplifier 100.

Bit lines BL and $\overline{\text{BL}}$ are coupled to input nodes Vin and $\overline{\text{Vin}}$ so that sense amplifier 100 can sense currents on bit lines BL and $\overline{\text{BL}}$ during reading of one of the memory cells 1,2, ... M. To read a selected one of memory cells 1,2, ... M, a voltage is asserted on a selected one of word lines WL1 to WLM, which causes one of the pairs of pass transistors PT1, PT1' through PTM, PTM' to connect the selected memory cell to bit lines BL and $\overline{\text{BL}}$. For example, when word line WLM is asserted, pass transistors PTM and PTM' connect memory cell M to bit lines BL and $\overline{\text{BL}}$, respectively. Depending on whether memory cell M is in a first or a second state (stores a "1" or a "0"), bit line BL will be driven high or low and bit line $\overline{\text{BL}}$ will be driven low or high, respectively when pass transistors PTM and PTM' are enabled. The driving of the bit lines BL and $\overline{\text{BL}}$ by a memory cell causes currents on bit lines BL and $\overline{\text{BL}}$.

The currents pull the voltage on one of the nodes Vin or $\overline{\text{VIN}}$ higher pull the voltage on the other node $\overline{\text{Vin}}$ or Vin lower, and eventually change voltages on nodes V1 and V2, currents in transistors Q1 and Q2, and voltages on output nodes Vout and $\overline{\text{Vout}}$. The rate of the change in voltage on output node Vout or $\overline{\text{Vout}}$ is related to the rate at which transistor Q1 or Q2 change its base-to-emitter voltage. The rates of change in the emitter voltages on nodes V1 and V2 are limited by the parasitic capacitances C1 and C2 which are charged/discharged as emitter voltages change. The change in base voltage of both transistors Q1 and Q2 is relatively insignificant because node V3 is coupled to Vcc via a resistor R0, and the current through resistor R0 is nearly constant. (Current source I3 typically provides a constant current which is much larger than the changes in base currents of transistors Q1 and Q2.)

One way to increase the rates of change in output voltages on nodes Vout and $\overline{\text{Vout}}$ is to increase the currents supplied by current sources I1 and I2 and thereby increase the amplification of transistors Q1 and Q2. Although increasing current increases the rate of change in the output voltages, increasing current also undesirably increases the power consumption of sense amplifier 100. Accordingly, there is a need for a current sense amplifier which more quickly provides desired output voltages without a corresponding increase in power consumption.

SUMMARY OF THE INVENTION

In accordance with this invention, prior art difficulties arising from the inability of a sense amplifier to quickly change emitter voltages of a pair of bipolar output transistors is overcome by adding circuitry which also changes the base voltages of the bipolar output transistors. Changing the emitter and base voltages the bipolar output transistors increases the speed of the sense amplifier without proportionally increasing power consumption.

In accordance with an embodiment of the invention, a sense amplifier has output voltages which depend on the collector currents of first and second transistors. The sense amplifier further includes third and fourth transistors having emitters coupled to a common current source. The third transistor has a collector coupled to the base of the first transistor and a base coupled to a first input node. The fourth transistor has a collector coupled to the base of the second transistor and a base coupled to a second input node. The third and fourth transistors amplify and invert voltage changes on the input nodes and apply the amplified voltage changes to the bases of the first and second transistors thereby changing the base, emitter, and collector currents of the first and second transistors.

BRIEF DESCRIPTION OF THE DRAWINGS

Similar or identical structures in the figures are given the same reference symbols.

DETAILED DESCRIPTION OF THE INVENTION

Figure 1:
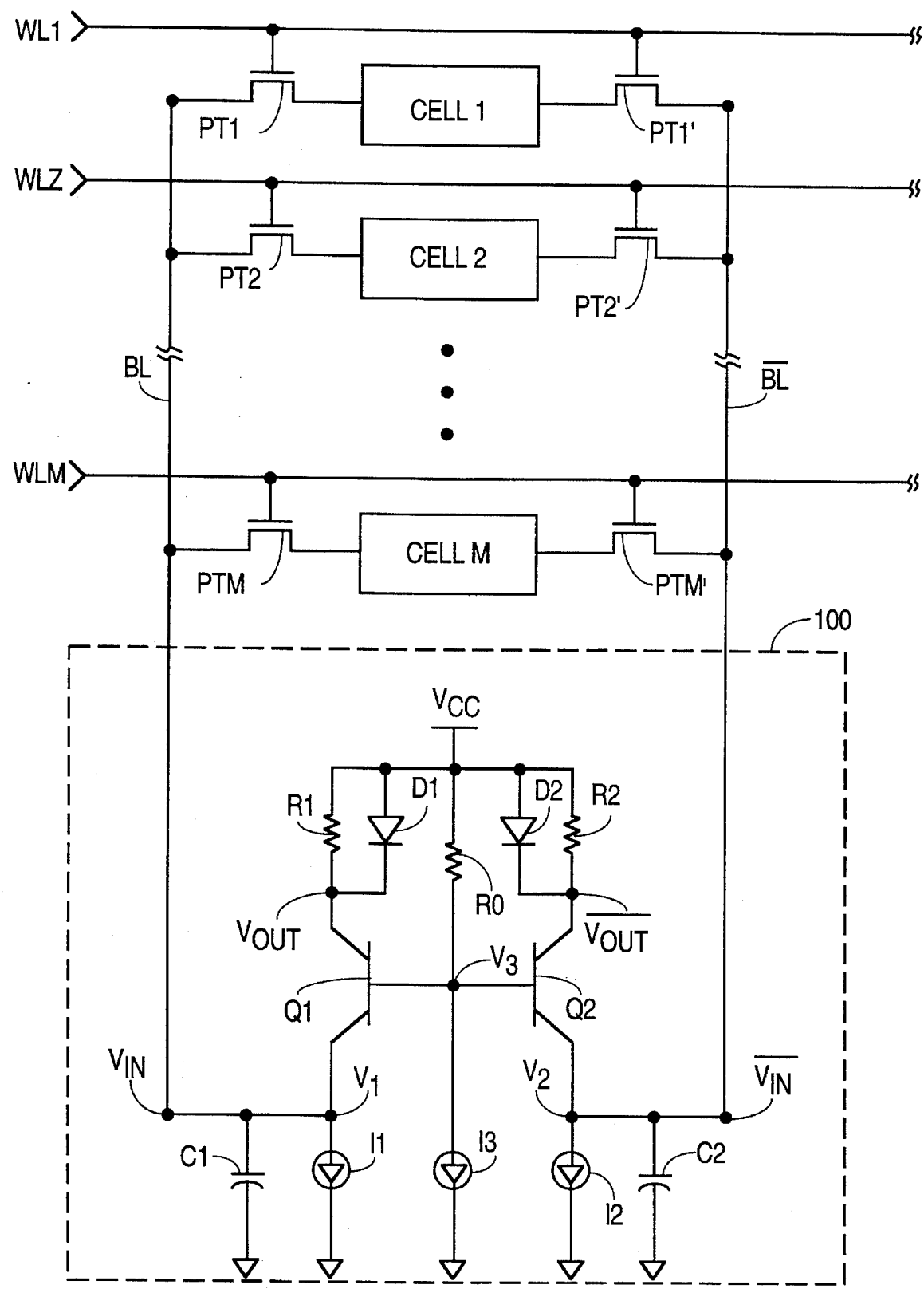
FIG. 1 is a schematic diagram of a conventional current sense amplifier connected to a column of memory cells.
Figure 2:
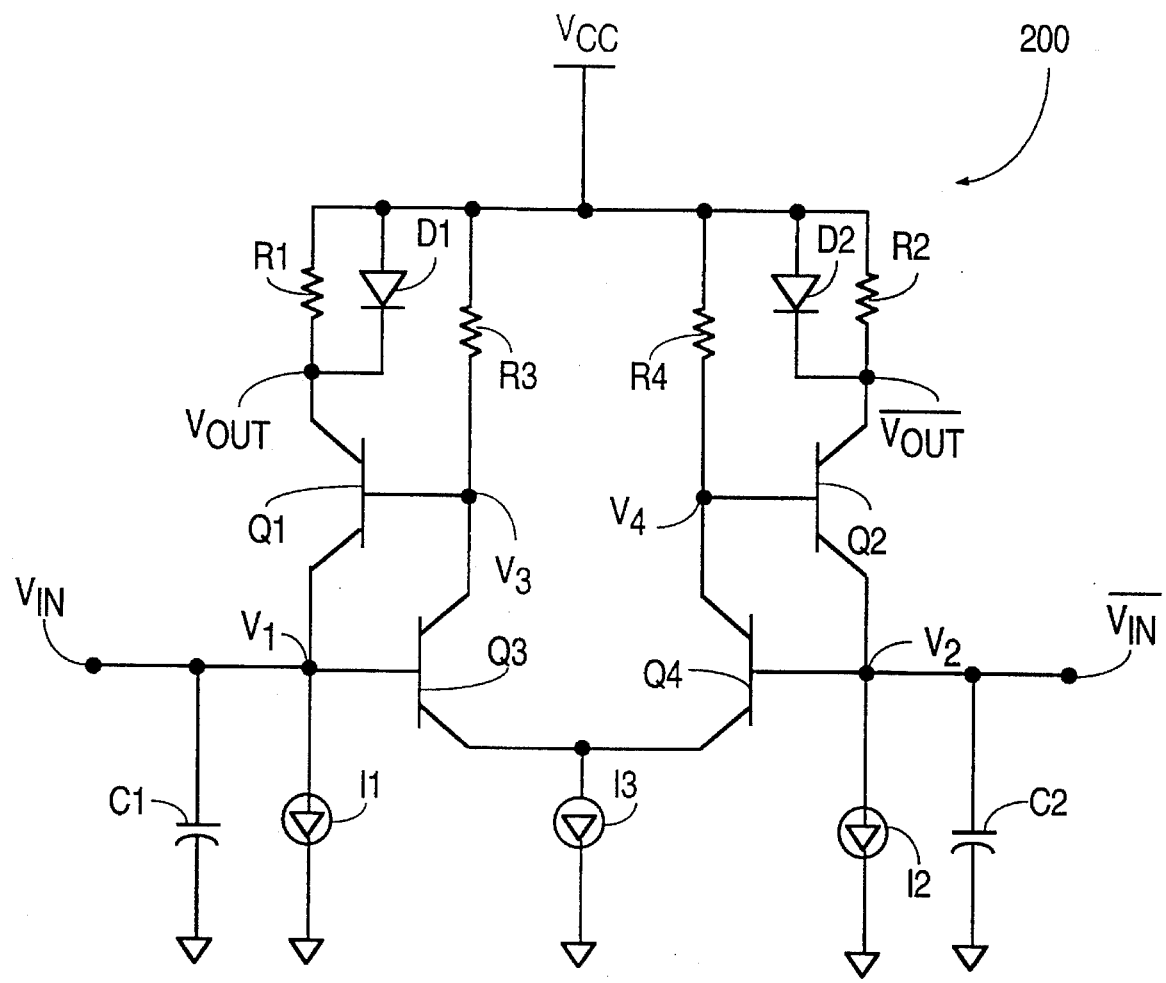
FIG. 2 is a schematic diagram of a high speed current sense amplifier in accordance with the invention.

FIG. 2 is a schematic drawing of a high-speed bipolar current sense amplifier 200 in accordance with an embodiment of the invention. Sense amplifier 200 is generally usable in known sense amplifier applications. For example, input nodes Vin and $\overline{\text{Vin}}$ of sense amplifier 200 can be coupled to a pair of bit lines and a column of memory cells so that sense amplifier 200 can amplify a signal indicating the logic state of a memory cell during reading of the memory cell. In another embodiment, sense amplifier 200 is connected to a column selection circuit for connecting a selected one of several columns of memory cells to sense amplifier 200 so that a memory cell in the selected column can be read. In addition, it is well known that a precharging circuit may be used for charging the bit lines to selected voltages before a memory cell is read.

Sense amplifier 200 includes a pair of bipolar output transistors Q1 and Q2 which have emitters coupled to input nodes Vin and $\overline{\text{Vin}}$ respectively and current sources I1 and I2 respectively. Parasitic capacitance inherent in input nodes Vin and $\overline{\text{Vin}}$ are indicated by capacitances C1 and C2 respectively. Capacitances C1 and C2 can be relatively large especially when nodes Vin and $\overline{\text{Vin}}$ are coupled to bit lines of a large memory array.

A collector of transistor Q1 (Q2) is connected to output node Vout ($\overline{\text{Vout}}$) and to a supply voltage Vcc through a resistor R1 (R2) and a diode D1 (D2). When the collector current through transistor Q1 or Q2 is zero or very low, the voltages on output nodes Vout and $\overline{\text{Vout}}$ are near the supply voltage Vcc. When the collector current through transistor Q1 or Q2 increases, the voltage on output node Vout or Vout drops. Diodes D1 and D2 limit the maximum reduction in voltage on output nodes Vout and $\overline{\text{Vout}}$ to approximately the supply voltage Vcc minus the threshold voltage (about 0.7 volts) of diodes D1 and D2. Diodes D1 and D2 may be omitted if such limitation is not desired.

The bases of output transistors Q1 and Q2 are coupled to a "long-tail pair" which includes a second pair of bipolar transistors Q3 and Q4. The emitters of transistors Q3 and Q4 are both coupled to a common current source I3. The collector of transistor Q3 (Q4) is coupled to the base of transistor Q1 (Q2) and to supply voltage Vcc via a resistor R3 (R4). The base of transistor Q3 (Q4) is coupled to the input node Vin ($\overline{\text{Vin}}$), the emitter of transistor Q1 (Q2), and current source I1 (I2). Transistors Q3 and Q4 operate in their linear regions, and when the voltage on input node Vin equals the voltage on input node $\overline{\text{Vin}}$, the current through transistor Q3 approximately equals the current through transistor Q4.

During a read cycle, a small differential between the base voltages (or base currents) of transistors Q3 and Q4 results in a relatively large differential between the collector currents of transistors Q3 and Q4 (and between voltages on nodes V3 and V4). Nodes V3 and V4 are coupled to the respective bases of transistors Q1 and Q2 so that changes in voltages on nodes V3 and V4 change the currents through transistors Q1 and Q2 which in turn change the voltages on output nodes Vout and $\overline{\text{Vout}}$. Because of the amplification of transistors Q1 and Q2, output nodes Vout and $\overline{\text{Vout}}$ undergo a voltage swing of a greater magnitude than the changes of the voltages on nodes Vin and $\overline{\text{Vin}}$.

The speed of sense amplifier 200 is substantially greater than the speed of prior art sense amplifier 100 because the switching speed of amplifier 200 is not solely dependent on changing the emitter voltages of transistors Q1 and Q2. In sense amplifier 200, the emitter and base voltages of transistors Q1 and Q2 change simultaneously and cause the base and collector currents of transistors Q1 and Q2 (and the voltages on output nodes Vout and $\overline{\text{Vout}}$) to change faster than in the prior art sense amplifier 100. Additionally, nodes V3 and V4 are low capacitance nodes so that the voltages on nodes V3 and V4 change much faster than the voltages on nodes Vin and $\overline{\text{Vin}}$. To provide the desired output voltages on nodes Vout and $\overline{\text{Vout}}$, the voltages on nodes Vin and $\overline{\text{Vin}}$ change much less in sense amplifier 200 than do the voltages on nodes Vin and $\overline{\text{Vin}}$ in sense amplifier 100. The faster change in the output voltages is especially important when input nodes Vin and $\overline{\text{Vin}}$ are high capacitance nodes such as when nodes Vin and $\overline{\text{Vin}}$ are connected to bit lines of a large memory array. The increased sensing speed is accomplished without a corresponding increase in the power consumption of amplifier 200 because current sources I1, I2, and I3 in amplifier 200 drive approximately the same currents as current sources I1, I2, and I3 of amplifier 100.

In one embodiment, the supply voltage Vcc is about 5 volts above the ground reference potential. Current sources I1 and I2 each supply a current of approximately 500 µAmps, and current source I3 supplies a current of about 250 µAmps. Resistors R1 and R2 have a resistance of about 1.6 kΩ, and resistors R3 and R4 have a resistance of about 800 Ω. The current capacity of transistors Q1 and Q2 is about 1000 µAmps. During sensing of current, one transistor Q1 or Q2 has an emitter current as large as 1000 µAmps, and the other transistor Q2 or Q1 has an emitter current of about 500 µAmps.

Although the present invention has been described with reference to particular embodiments for illustrative purposes, the present invention is not limited thereto. In particular, although the embodiments described employ NPN bipolar transistors, PNP bipolar transistors and other amplifying switches which have control terminals and current carrying terminals may be employed. Additionally, each current source employed may include a terminal for accepting a signal which disables current flow and stops power consumption of the current source. Signals could then be asserted to the current sources to place the sense amplifier in low power consumption (standby) mode. Further, the principles of this invention apply equally to any high speed sensing techniques and are not limited to a current sense amplifier for a memory array. Accordingly, various modifications, adaptations, and combinations of features of the disclosed embodiments can be practiced without departing from the scope of the invention set forth in the following claims.

We claim:

1. A sense amplifier comprising:

a first and a second input node;

a first and a second output node;

a first, a second, and a third current source, wherein the third current source supplies a current which is less than a current supplied by the first current source;

a first, a second, a third, and a fourth resistive load;

a first amplifying switch having a first current carrying terminal coupled to the first resistive load and to the first output node, a second current carrying terminal coupled to the first current source and to the first input node, and a control terminal;

a second amplifying switch having a first current carrying terminal coupled to the second resistive load and to the second output node, a second current carrying terminal coupled to the second current source and to the second input node, and a control terminal;

a third amplifying switch having a control terminal coupled to the first input node, a first current carrying terminal coupled to the third current source, and a second current carrying terminal coupled to the third resistive load and to the control terminal of the first amplifying switch; and a fourth amplifying switch having a control terminal coupled to the second input node, a first current carrying terminal coupled to the third current source, and a second current carrying terminal coupled to the fourth resistive load and to the control terminal of the second amplifying switch.

2. The amplifier of claim 1, wherein each of the first, second, third, and fourth amplifying switches comprises a transistor.

3. The amplifier of claim 2, wherein each of the first, second, third, and fourth resistive loads comprises a resistor.

4. The amplifier of claim 3, wherein each of the first and second resistive loads further comprises a diode connected in parallel with the resistor.

5. An amplifier comprising:

a first and a second input node;

a first and a second output node;

a first, a second, and a third current source; wherein the third current source supplies a current which is less than a current supplied by the first current source;

a first transistor having a collector coupled to the first output node, and an emitter coupled to the first current source and to the first input node;

a first resistor having a first terminal coupled to the collector of the first transistor and a second terminal for connecting to a voltage source;

a second transistor having a collector coupled to the second output node, and an emitter coupled to the second current source and to the second input node;

a second resistor having a first terminal coupled to the collector of the second transistor and a second terminal for connecting to the voltage source;

a third transistor having an emitter coupled to the third current source, a base coupled to the first input node, and a collector coupled to a base of the first transistor;

a third resistor having a first terminal for connecting to the voltage source and a second terminal coupled to the collector of the third transistor and to the base of the first transistor;

a fourth transistor having an emitter coupled to the third current source, a base coupled to the second input node, and a collector coupled to a base of the second transistor; and a fourth resistor having a first terminal for connecting to the voltage source and a second terminal coupled to the collector of the fourth transistor and to the base of the second transistor.

6. The amplifier of claim 5, further comprising a diode connected in parallel with the first resistor.

7. The amplifier of claim 5, wherein the third and the fourth transistors are NPN bipolar transistors.

8. The amplifier of claim 7, wherein the first and the second transistors are NPN bipolar transistors.

9. The amplifier of claim 5, wherein the second current source supplies a current which is equal to the current supplied by the first current source.

\* \* \* \* \*